(12) United States Patent
Mok et al.

(10) Patent No.: US 7,807,933 B2
(45) Date of Patent: *Oct. 5, 2010

(54) RADIO FREQUENCY ISOLATION CONTAINER

(75) Inventors: Winston Mok, Waterloo (CA); Alexander Koch, Waterloo (CA); Arkady Ivannikov, Waterloo (CA)

(73) Assignee: Research In Motion Limited, Waterloo, Ontario (CA)

( * ) Notice: Subject to any disclaimer, the term of this patent is extended or adjusted under 35 U.S.C. 154(b) by 0 days.

This patent is subject to a terminal disclaimer.

(21) Appl. No.: 12/117,186

(22) Filed: May 8, 2008

(65) Prior Publication Data

US 2008/0202805 A1     Aug. 28, 2008

Related U.S. Application Data

(63) Continuation of application No. 11/249,409, filed on Oct. 14, 2005, now Pat. No. 7,388,160.

(60) Provisional application No. 60/693,092, filed on Jun. 23, 2005.

(51) Int. Cl.
*H05K 9/00* (2006.01)
*G01R 31/02* (2006.01)

(52) U.S. Cl. .................. 174/382; 174/377; 324/755

(58) Field of Classification Search ............ 174/350, 174/377, 382; 361/816, 818, 800; 324/755
See application file for complete search history.

(56) References Cited

U.S. PATENT DOCUMENTS

| | | | |
|---|---|---|---|
| 2,881,944 A | 4/1959 | Johnson | |
| 3,578,749 A | 5/1971 | Woten | |
| 4,669,625 A | 6/1987 | Armstrong | |
| 5,436,567 A * | 7/1995 | Wexler et al. | 324/754 |
| 5,594,200 A | 1/1997 | Ramsey | |
| 5,831,160 A | 11/1998 | Steketee | |
| 6,563,297 B1 | 5/2003 | Boswell et al. | |
| 6,715,715 B1 * | 4/2004 | Petersen | 244/114 R |
| 6,825,652 B2 * | 11/2004 | Zhao et al. | 324/158.1 |
| 7,443,183 B2 * | 10/2008 | Yin et al. | 324/755 |
| 2004/0257097 A1 | 12/2004 | Beaucag et al. | |

FOREIGN PATENT DOCUMENTS

| | | |
|---|---|---|
| EP | 0053300 | 6/1982 |
| EP | 1493707 | 1/2005 |
| WO | 96/09455 | 3/1996 |

OTHER PUBLICATIONS

Agilent Technologies; TS-50 RF Shielded Test Fixtures Catalog; Jun. 2000; pp. 1-8; Agilent Technologies; U.S.A.

(Continued)

*Primary Examiner*—Hung V Ngo
(74) *Attorney, Agent, or Firm*—Bereskin & Parr LLP/S.E.N.C.R.L., s.r.l.

(57) ABSTRACT

An RF isolation container that includes a counterweight system to assist an operator with opening and closing operations, an electromagnet locking mechanism for easier and consistent locking of the RF isolation container and a motion damping mechanism to relieve fatigue on operating components and on human operators.

19 Claims, 9 Drawing Sheets

OTHER PUBLICATIONS

Patent Cooperation Treaty—International Searching Authority, Written Opinion of the International Searching Authority, Feb. 23, 2006, WIPO.
Patent Cooperation Treaty—International Searching Authority, International Search Report, Mar. 8, 2006, WIPO.
Co-pending U.S. Appl. No. 11/249,409, "Radio Frequency Isolation Container", filed Oct. 14, 2005. (Retrievable from PAIR).
Supplementary European Search Report. Application No. 05794500.8 Dated: Feb. 9, 2009.
Chinese First Office Action. Application No. 200580050049.7. Dated: Sep. 4, 2009.
Mexican 1st Office Action. Application No. MX/a/2007/015805. Dated: Feb. 9, 2010.
China Notification of Completion of Formalities for Registration and Notification of Grant of Invention Patent (English Translation). Application No. 200580050049.7. Dated Feb. 5, 2010.
Summons to Attend Oral Proceedings Pursuant to Rule 115(1) EPC. Application No. 05794500.8. Dated: Jun. 15, 2010.

* cited by examiner

RADIO FREQUENCY ISOLATION CONTAINER

CROSS REFERENCE TO RELATED APPLICATION

This application is a continuation of prior U.S. patent application Ser. No. 11/249,409, filed on Oct. 14, 2005 now U.S. Pat. No. 7,388,160, which claims the benefit of provisional application Ser. No. 60/693,092, filed Jun. 23, 2005; the entirety of U.S. patent application Ser. No. 11/249,409 is hereby incorporated by reference.

FIELD OF THE INVENTION

The invention generally relates to radio frequency (RF) isolation containers, and, more particularly relates to an RF isolation container that includes a counterweight, electromagnetic locking mechanism and/or motion dampers.

BACKGROUND OF THE INVENTION

Radio frequency (RF) isolation containers are used to test the operation of equipment in an isolated environment where the equipment will not be affected by external radio frequency interference. In a particular case, the RF isolation container may also include internal damping of RF waves so that the equipment will not be affected by reflected RF waves generated by the operation of the equipment itself.

A conventional RF isolation container generally includes a cast or welded rectangular housing that is divided into a top portion and a bottom portion. The top portion and the bottom portion are connected by a hinge at one end thereof. The bottom portion typically has walls with a grooved joint running around the top of the walls. The grooved joint is designed to receive the edge of the walls of the top portion when the top portion is closed. Further, the grooved joint is generally provided with a metallic mesh gasket or the like to ensure electrical contact between the top portion and the bottom portion.

Conventional RF isolation containers also typically have a handle for raising and lowering the top portion. Since the top portion can be heavy, a support system, such as gas cylinders or the like, are typically provided to assist with opening/closing of the RF isolation container or holding it in an open position. The support system may be provided either internal or external to the RF isolation container.

A conventional RF isolation container also generally includes a locking mechanism to allow a user to lock the top portion in place against the bottom portion with sufficient pressure to ensure that an electrical connection between the top portion and bottom portion is complete and remains consistent throughout the test procedure. Typical locking mechanisms may rely on the weight of the top portion to ensure an appropriate closure or may involve a mechanical mechanism in which the handle is pushed with sufficient pressure to engage a mechanical lock.

Conventional RF isolation containers present several problems, particularly in a manufacturing environment.

In the area of ergonomics, there may be issues with the types of motions/pressures that need to be applied in the operation of the RF isolation container. For example, the locking mechanism in conventional RF isolation containers can also be problematic from a health and safety viewpoint. In some cases, the lock requires exertion by the operator of significant additional pressure to lock the lid in place against the gaskets or to activate the locking mechanism. Similarly, pressure may be required to later unlock the lid against the pressure that has had to be exerted to engage the lock. This additional pressure requirement and the additional movements and possible jarring required can lead to health and safety issues, such as repetitive strain injury and the like.

In the area of maintenance, there can be issues related to the number/type of parts in an RF isolation container. For example, from a maintenance standpoint, it can be difficult to determine when gas cylinders used in supporting the lid may need maintenance or be likely to break. As such, there are difficulties in ensuring that the gas cylinder supports for the container lid are functioning correctly. If the gas cylinders fail while a worker has a hand inside the RF isolation container, there is a safety issue. Similar concerns can also arise with regard to RF isolation containers that have a snap-closing mechanism which relies on the weight of the lid to complete the seal of the RF isolation container.

Another maintenance issue relates to cleaning of the conventional RF isolation containers. It can be difficult to remove dust or other material that may enter the base of the RF isolation container and can be difficult to clean the grooved joint provided in the walls of the bottom portion for receiving the walls of the top portion.

As such, there is a need for an improved RF isolation container.

BRIEF DESCRIPTION OF THE DRAWINGS

For a better understanding of embodiments of the invention, and to show more clearly how they may be carried into effect, reference will now be made, by way of example, to the accompanying drawings in which.

DETAILED DESCRIPTION OF EMBODIMENTS OF THE INVENTION

Figure 1:
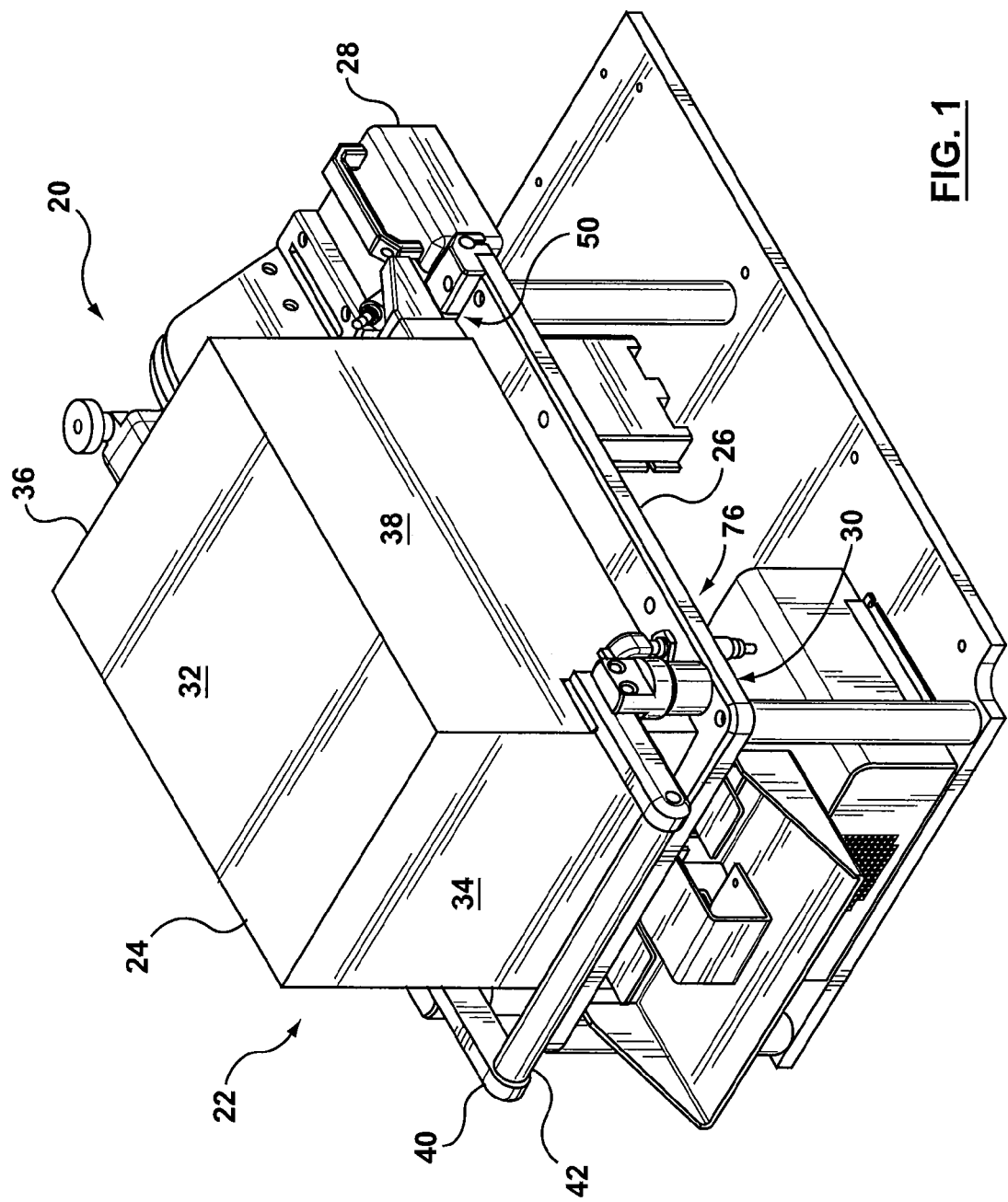
FIG. 1 is an isometric view of an RF isolation container according to one example implementation.

According to one embodiment of the invention, there is provided an RF isolation container including: an electrically conductive housing, including a lid hingedly connected to a base such that the lid can be moved between an open position and a closed position; a counterweight provided to the housing such that the lid is biased to be in the open position; and a locking mechanism provided to the housing to lock the lid to the base when in the closed position. The counterweight allows the lid to open automatically following a test and also allows the lid to be moved by an operator with very little force.

In a particular case, the locking mechanism is an electromagnet locking mechanism including: an electromagnet provided to one of the lid and the base; and a strike provided to the other of the lid and the base, such that when the lid is being closed, the strike comes into an electromagnetic field generated by the electromagnet and is drawn to and held by the electromagnet such that the lid is closed with a predetermined amount of pressure. The use of an electromagnet locking mechanism allows the lid to be locked with little pressure by the operator and also allows for a more consistent locking pressure and seal of the RF isolation container.

In this particular case, the electromagnet is preferably a DC electromagnet. In this case, the container may further include a sealing system between the base and the lid to reduce wear on the lid and the base while providing electrical contact between the lid and the base when the lid is in the closed position and the predetermined amount of pressure for the electromagnet is determined based on the force needed to form the electrical contact between the lid and the base. In particular, the sealing system may include a metallic gasket provided to the base such that the lid contacts with the gasket when closed. Preferably, the base is provided with a groove and the metallic gasket is placed in the groove to be flush with the upper surface of the base. The metallic gasket is preferably a fabric having metal strands.

In another particular case, the container may further include a motion damping mechanism that slows the movement of the lid when the lid approaches the open position. The motion damping mechanism may include one or more motion dampers provided to the base and arranged such that the motion dampers contact a rear of the lid when the lid is moved to the open position to dampen the motion of the lid towards the open position.

In another particular case, the container may further include a motion damping mechanism that slows the movement of the lid when the lid approaches the closed position. The motion damping mechanism may include one or more motion dampers provided to the base and one or more damper contactors provided to the lid, arranged such that the damper contactors contact the motion dampers when the lid is moved to a closed position to dampen the motion of the lid towards the closed position.

The use of motion dampers lessens wear on components of the RF isolation container such as hinges and locks and can reduce strain on operators.

In other particular cases, the base may be substantially flat and the lid may be a single formed piece of metal.

According to another embodiment of the invention, there is provided an RF isolation container including: an electrically conductive housing, including a lid hingedly connected to a base such that the lid can be moved between an open position and a closed position; and an electromagnetic locking mechanism provided to the housing to lock the lid to the base when the lid is in a closed position. The electromagnetic locking mechanism includes: an electromagnet provided to one of the lid and the base; and a strike provided to the other of the lid and the base, such that when the lid is being closed, the strike comes into the electromagnetic field generated by the electromagnet and is drawn to the electromagnet such that the lid is closed with a predetermined amount of pressure.

In a particular case, the electromagnetic locking mechanism may include at least two electromagnets and strikes arranged on opposite sides of the lid so that even pressure is applied during locking of the lid.

Figure 2:
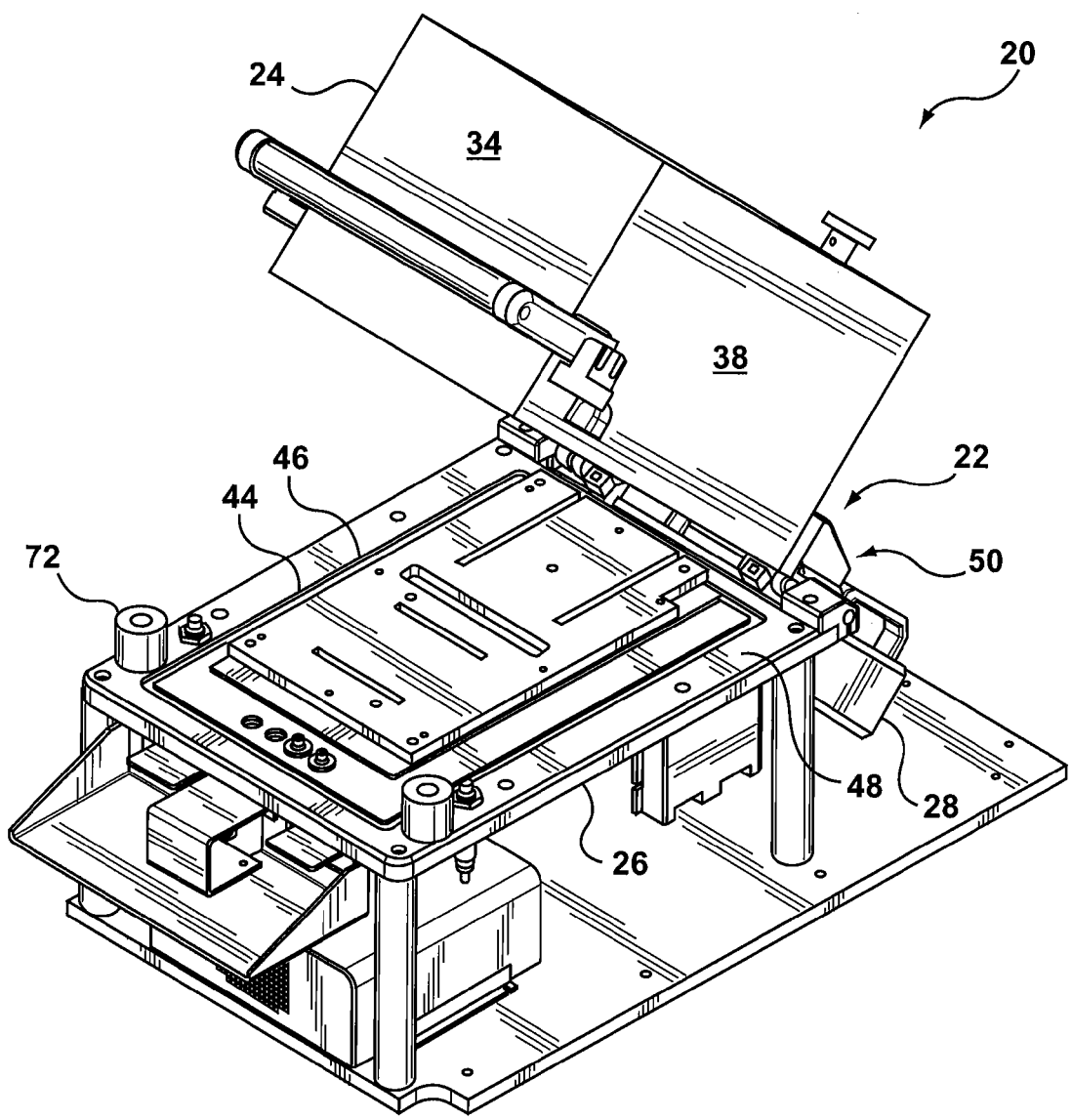
FIG. 2 is an isometric view of the RF isolation container of FIG. 1 in an open position.
Figure 3:
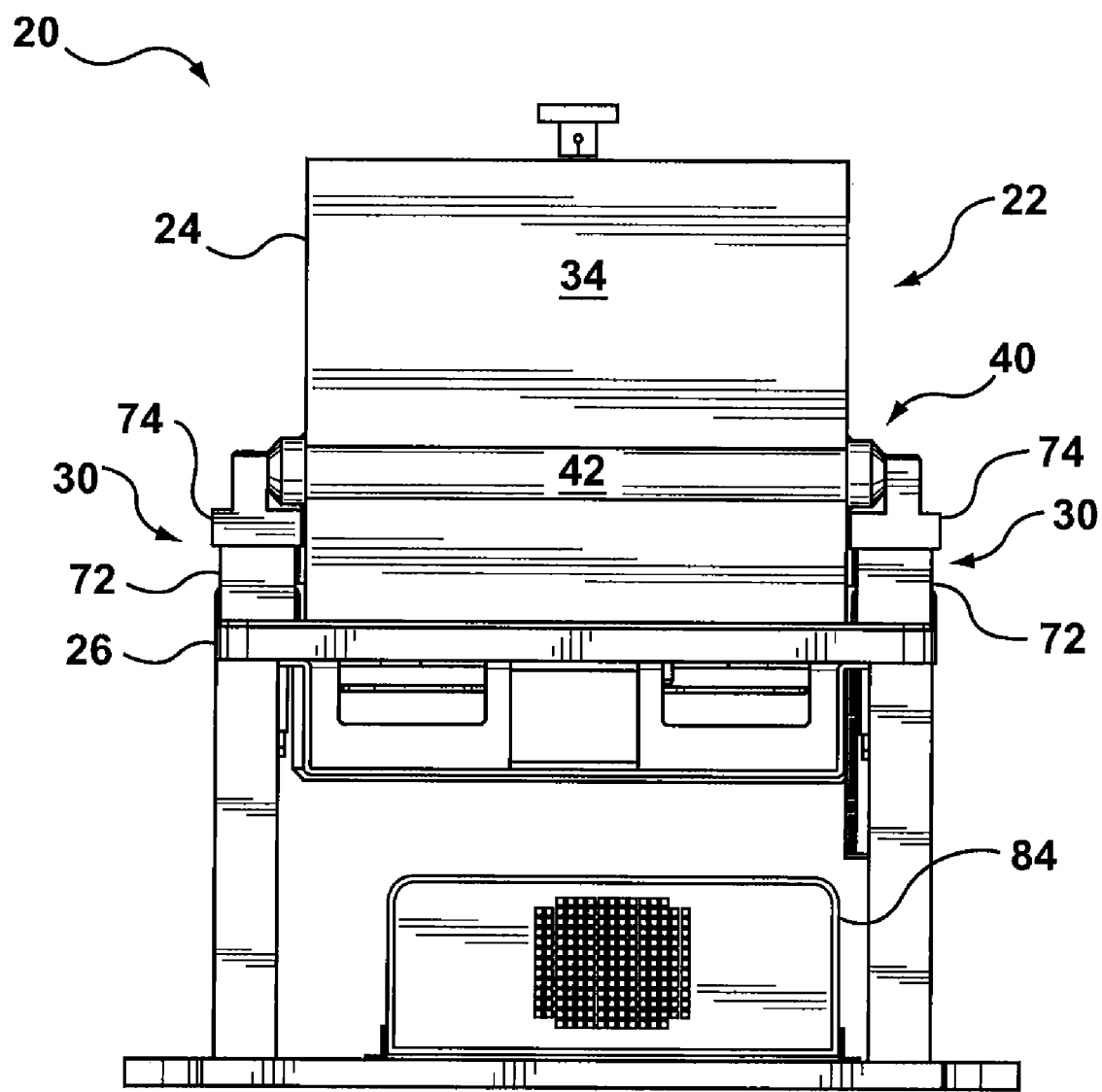
FIG. 3 is a front view of the RF isolation container of FIG. 1.

FIG. 1 shows an isometric view of an RF isolation container 20 according to an example implementation. FIG. 2 shows an isometric view of the RF isolation container 20 of FIG. 1 in an open position.

As generally shown in FIGS. 1 and 2, the RF isolation container 20 includes a housing 22, including a lid 24 and a base 26, a counterweight 28, and a locking mechanism 30. In order to provide RF shielding, the housing is an electrically conductive material.

In this example implementation, the lid 24 is a rectangular box formed having a top 32 as well as front 34, rear 36 and side 38 walls extending downward from the top 32. It will be understood that other shapes for the lid 24 may also be used. The lid 24 is preferably formed as a single piece of metal, preferably aluminum, without any holes so that there is reduced risk of leakage of RF interference into the RF isolation container 20. The base 26 is a flat surface that is also preferably formed from a solid piece of metal, preferably aluminum. The base is substantially flat in order to make it easier to wipe clean of dust or other debris that may settle on the base 26 or otherwise enter the RF isolation container 20.

In order to allow for the provision of control signals and the like to the object to be tested, the base 26 is provided with a limited number of access holes. Limiting the number of access holes decreases the chance of RF interference entering the RF isolation container 20. Further, each of the holes in the base 26 is filtered in order to limit the entry of any outside RF interference.

In this implementation, the lid 24 is provided with an externally mounted handle 40, which is mounted to the side walls 38 of the lid 24 by welding so that mounting holes are not made in the lid 24. The handle 40 extends outward from a front wall 34 of the lid 24 and spans the width of the lid 24. In particular, the handle 40 preferably has a diameter which is ergonomically appropriate and is preferably provided with foam padding 42 for operator comfort.

As can be seen in FIG. 2, the base 26 is provided with a groove 44, which is formed to match with the shape of the lid 24, such that the walls 34, 36, 38 of the lid 24 will fit into the groove 44 when the lid 24 is closed. The groove 44 is further provided with a metallic gasket 46, such that, when closed, the lid 24 seats directly against the gasket 46. The gasket 46 is provided so that the lid 24 does not make direct contact with the base 26, which could cause wear and allow RF leakage. The gasket 46 allows electrical contact between the lid 24 and the base 26 and is flexible to minimize the size of any potential RF openings through which external RF signals could leak. The gasket 46 is preferably a fabric material having metallic threads therein or thereon, however, other types of known metallic gaskets such as those having metallic fingers or the like may also be used. The groove 44 and gasket 46 together form a sealing system between the lid 24 and the base 26. In a particular case, the gasket 46 is preferably arranged in the groove 44 such that the gasket 46 is flush with the upper surface 48 of the base 26, allowing the surface 48 of the base 26 to be cleaned by brushing any dust/debris off of the base plate.

The lid 24 is hinged to the base 26 by a hinge 50. In this implementation, the hinge 50 is provided at the rear of the housing 22. The hinge 50 allows the lid 24 to move between a closed position as shown in FIG. 1 and an open position as shown in FIG. 2.

FIGS. 3, 4, 6, 7, and 8 are front, right, rear, left and top views of the RF isolation container 20 of FIG. 1. FIG. 5 is a right side view of the RF isolation container 20 of FIG. 1 in an open position. These views provide further detail on elements of this example implementation.

Figure 4:
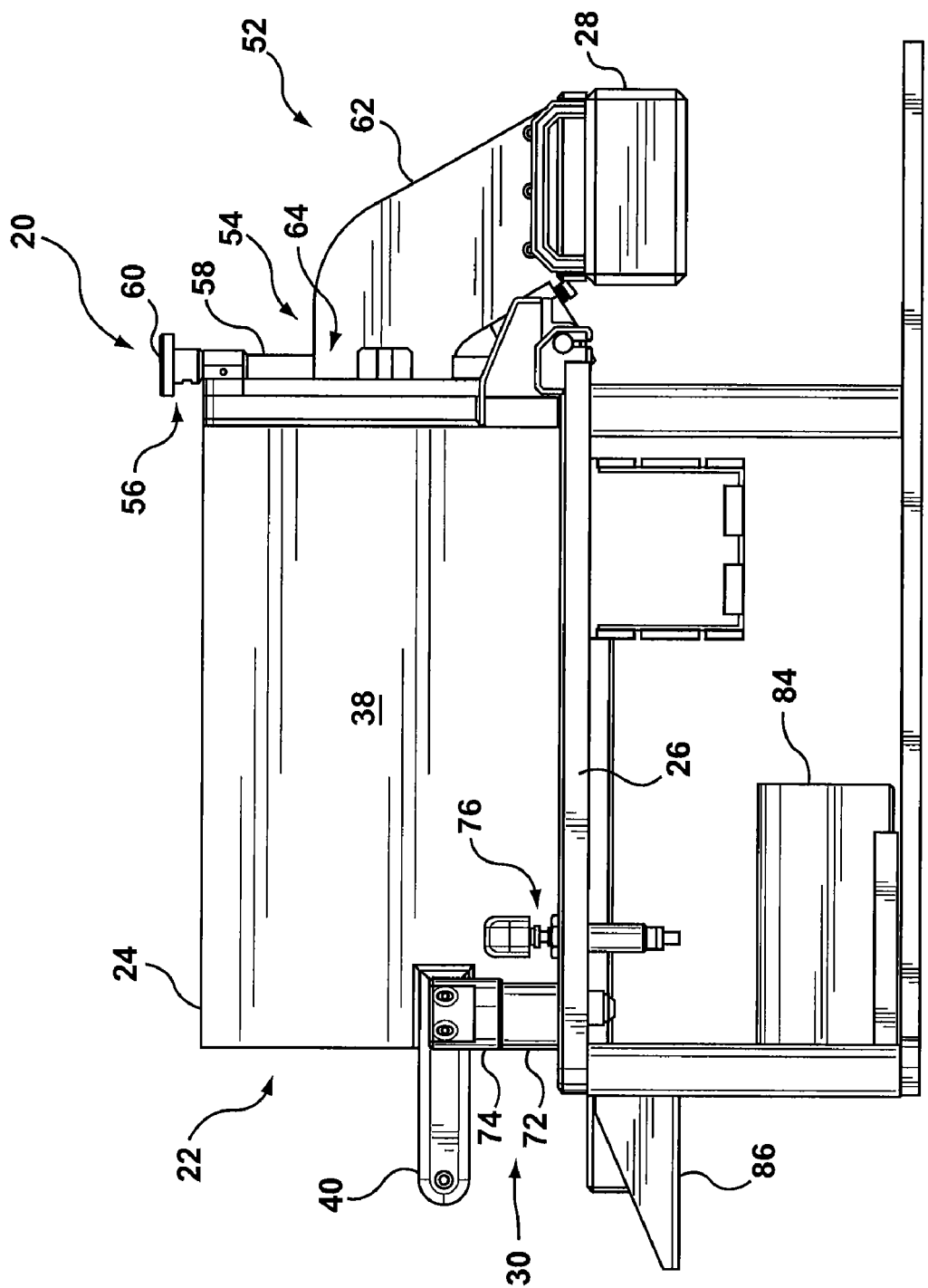
FIG. 4 is a right side view of the RF isolation container of FIG. 1.
Figure 5:
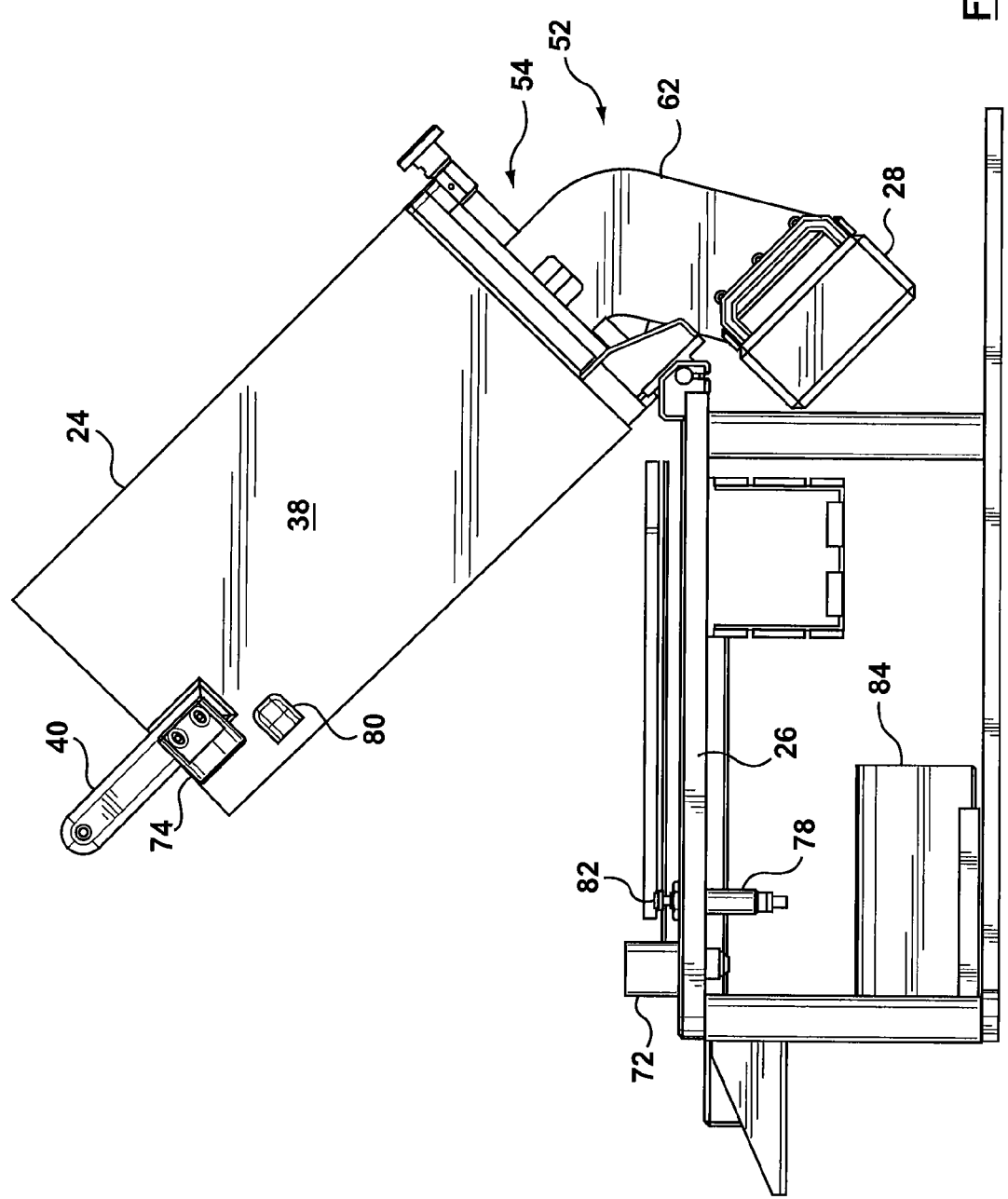
FIG. 5 is a right side view of the RF isolation container of FIG. 1 in an open position.
Figure 6:
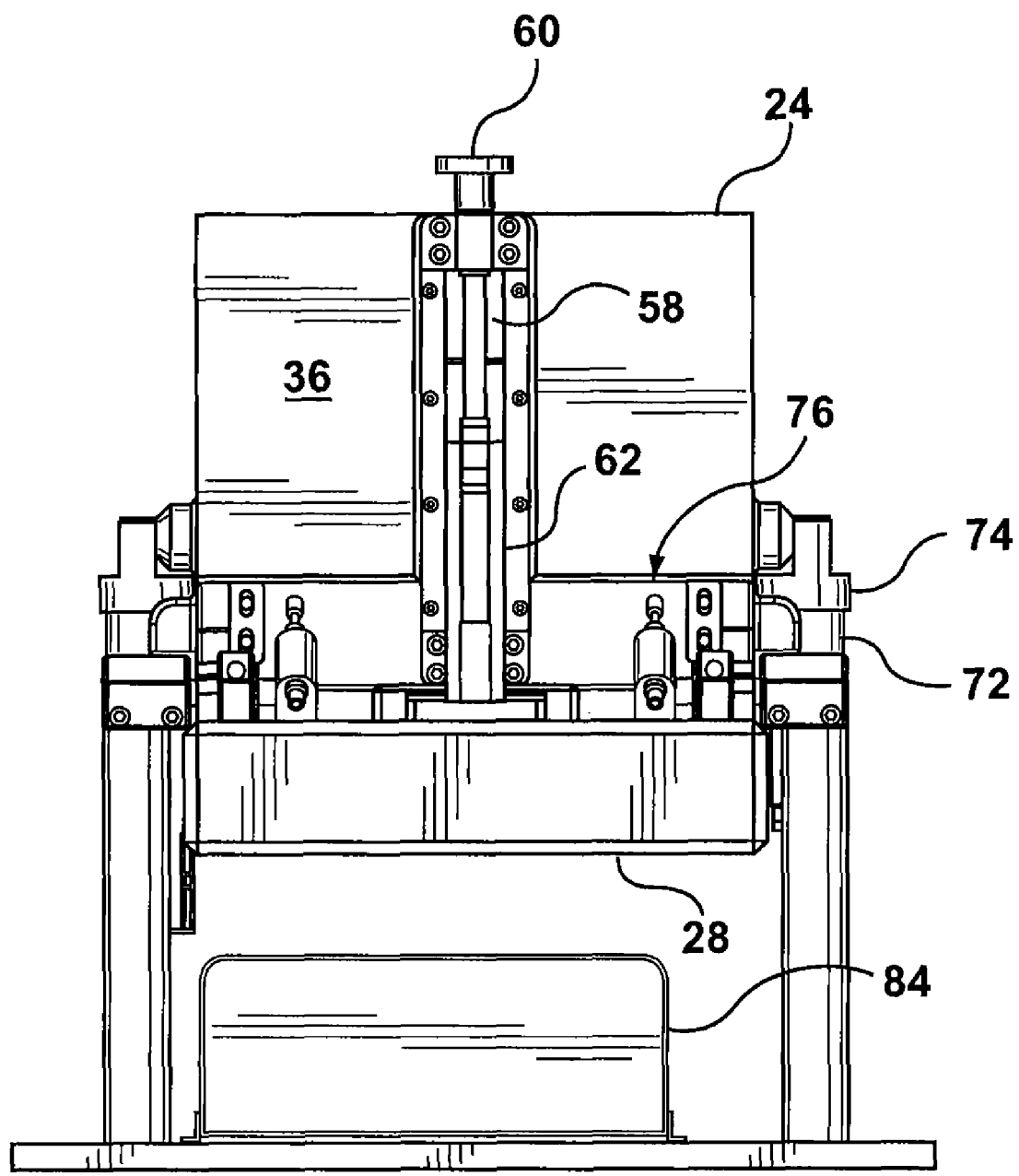
FIG. 6 is a rear view the RF isolation container of FIG. 1.
Figure 7:
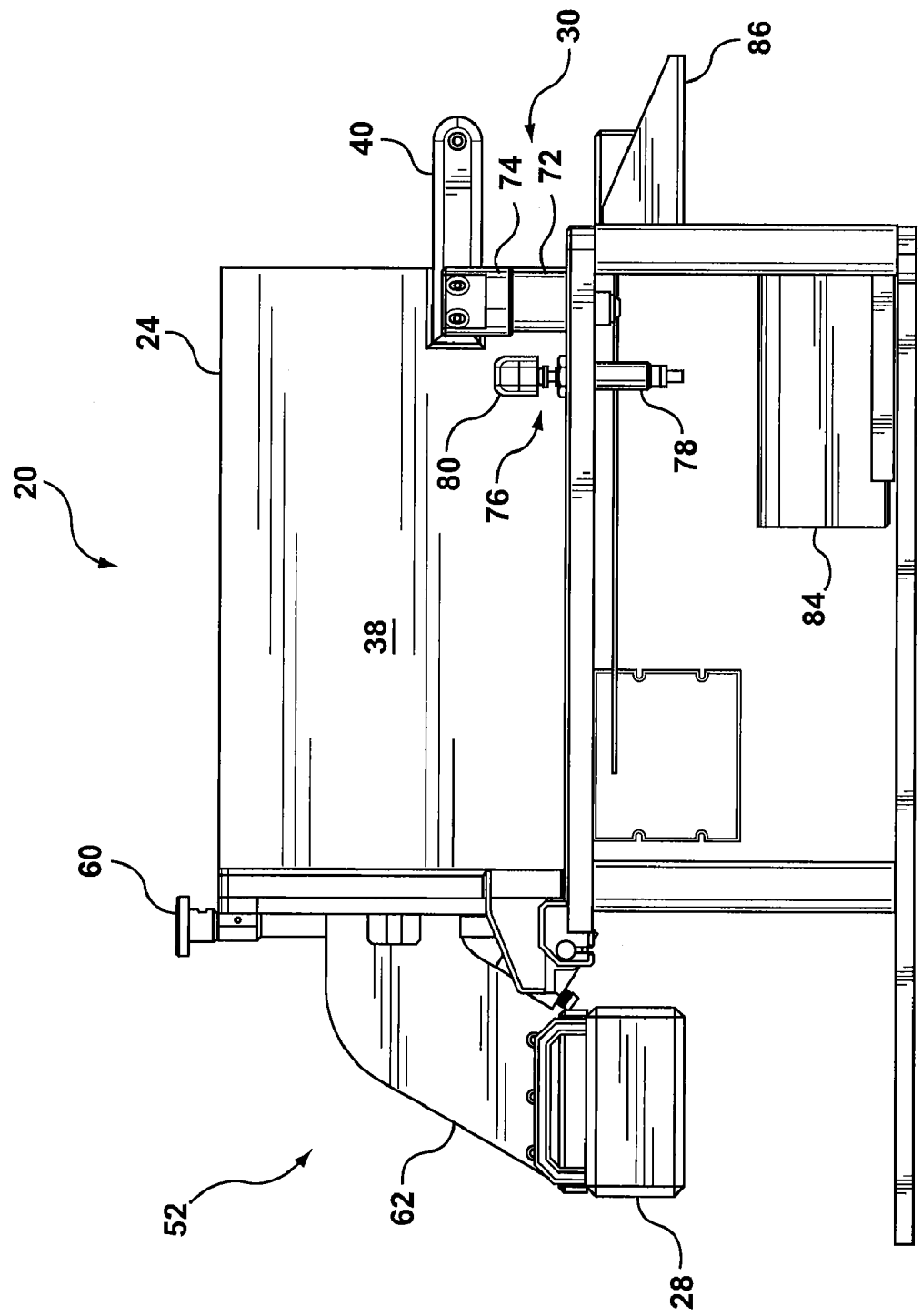
FIG. 7 is a left side view of the RF isolation container of FIG. 1.
Figure 8:
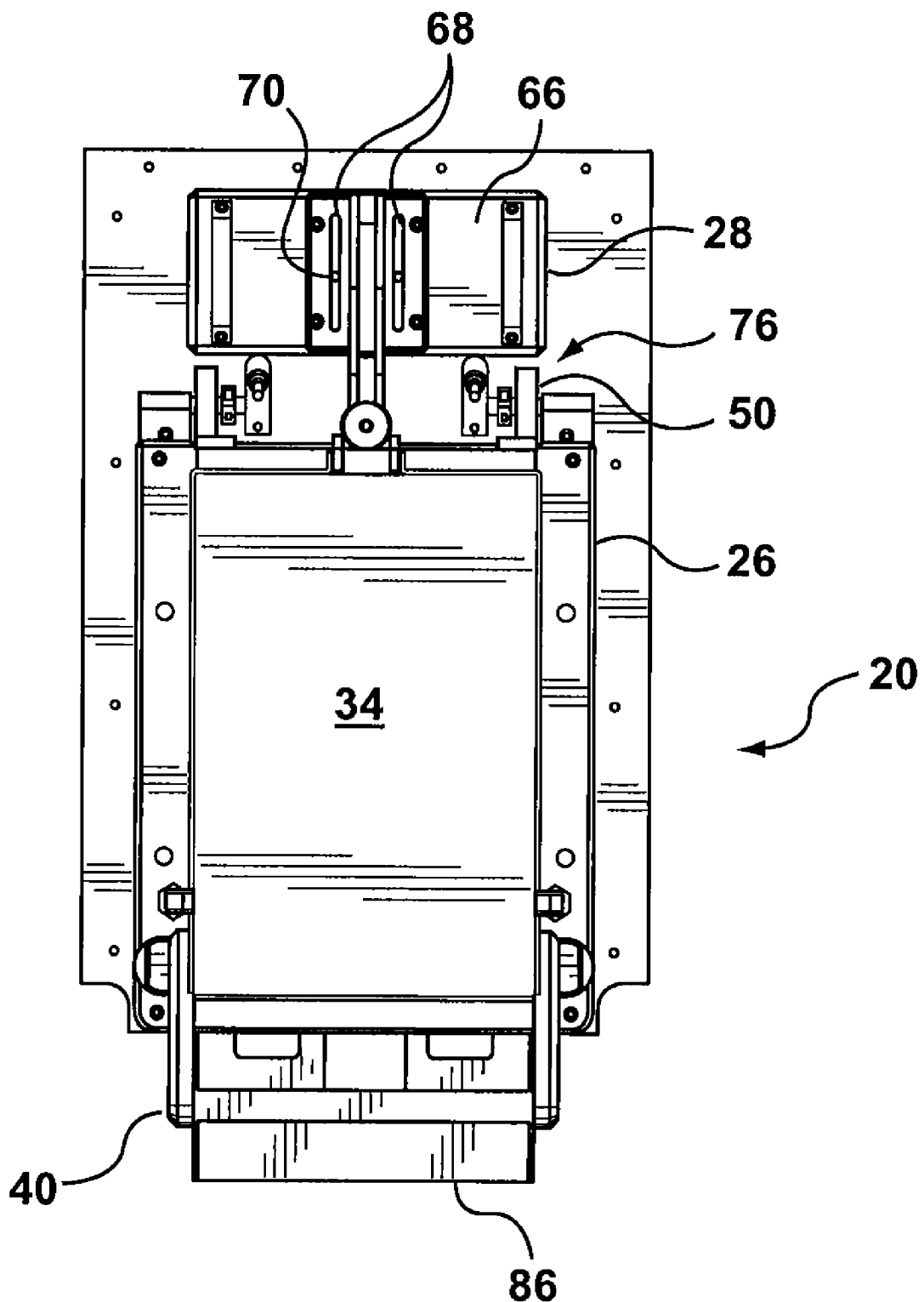
FIG. 8 is a top view of the RF isolation container of FIG. 1.

As can be seen in more detail in FIGS. 4, 5, and 6, the lid 24 is provided with a counterweight system 52. The counterweight system is preferably adjustable so that the counterweight 28 can be moved in relation to the lid 24 or housing 22 in order to appropriately bias the lid 24 to an open position.

In this implementation, the counterweight system 52 includes the counterweight 28 and a counterweight adjustment system 54.

The counterweight 28 is a suitable weight of material to counterbalance the weight of the lid 24. In this implementation, the counterweight 28 is formed from stainless steel.

The counterweight adjustment system 54 includes a counterweight support frame 56, which, in this embodiment, is welded to the rear of the lid 24. The counterweight adjustment system 54 also includes a counterweight adjustment gear 58, which is a worm gear with a knob 60 on the end, and a counterweight support arm 62, which includes a geared bore 64, which matches with the counterweight adjustment gear 58. The counterweight adjustment gear 58 is rotatably connected with the counterweight support frame 56 and is engaged with the geared bore 64 of the counterweight support arm 62 such that turning the counterweight adjustment gear 58 causes the counterweight support arm 62 to move up or down vertically in relation the rear of the lid 24.

The counterweight support arm 62 extends out from the counterweight adjustment gear 58 and is movably attached to an upper surface 66 of the counterweight 28. In particular, the counterweight support arm 62 is provided with two grooves 68 and the counterweight 28 is attached to the counterweight support arm 62 by screws 70 or the like, which engage the grooves 68 on the counterweight support arm 62. By loosening the set screws 70, the counterweight 28 can be moved in a horizontal direction either closer to or further away from the RF isolation container 20.

In this implementation, the counterweight system 52 allows the counterweight 28 to be adjusted in two directions in relation to the lid 24. This allows the counterweight 28 position to be adjusted to appropriately bias the lid 24 to an open position for each particular RF isolation container 20 and can be adjusted if the configuration of an RF isolation container 20 is changed, for example, by the addition of internal damping (not shown) to the interior of the RF isolation container 20 or the like.

In order to seal the RF isolation container 20 during test and since the lid 24 is biased by the counterweight 28 to be in an open position, the RF isolation container 20 is provided with a locking mechanism 30. In this example implementation, the locking mechanism 30 is an electromagnetic locking mechanism as shown in FIGS. 4, 5 and 6. Other types of locking mechanisms could also be used. The electromagnetic locking mechanism 30 consists of a pair of electromagnets 72 affixed to the base 26 and corresponding metal attachments 74, each referred to as a "strike", provided to the sides of the lid 24 and positioned to make contact with the electromagnets 72 when the lid 24 is closed. It will be understood that providing an electromagnet on each side of the lid 24 is preferable in order to provide more uniform pressure between the lid 24 and the gasket 46 on base 26. However, other arrangements may also be used to achieve the electromagnetic locking effect.

It is preferable that the electromagnets 72 be DC electromagnets. Since DC magnets operate at zero hertz (DC is inherently without any frequency), it will be understood that DC magnets will not produce any direct frequencies or any resonant frequencies that could affect the overall performance of the RF isolation container 20. It is also preferable that the power supply for the electromagnets 72 be a clean DC power supply so that there is less chance of influence from an AC signal. It is further preferable that the electromagnets 72 be configured such that the magnetic field strength weakens quickly with distance from the electromagnet 72. Initial tests indicate that the DC electromagnets 72 will not cause any substantial issues with RF testing within the RF isolation container 20.

The use of electromagnets 72 for the locking mechanism 30 provides a generally consistent amount of pressure when sealing the RF isolation container 20 and also relieves operator fatigue that could occur with a mechanical locking mechanism.

As shown in the figures, this example implementation of the RF isolation container 20 further includes motion damping mechanisms 76 that slow the movement of the lid 24 as the lid 24 approaches both the open position (opening phase) and the closed position (closing phase).

The motion damping mechanism 76 at the closing phase includes a pneumatic/gas strut 78 provided to the base 26 and a damper contactor 80 provided to the side wall 38 of the lid 24 such that, as the lid 24 moves towards a closed position, the damper contactor 80 comes into contact with a head 82 of the gas strut 78. The gas strut 78 then compresses at a predetermined rate to dampen the motion of the lid 24 as it moves to a closed position. The motion damping mechanism 76 may include a similar arrangement on each side of the lid 24 to provide uniform damping at each side of the lid 24 during closing. Alternate arrangements and/or additional gas struts 78 and contactors 80 may be used if necessary to further assist with the damping. It will be understood by one of skill in the art that the gas struts 78 used in this implementation are just one type of damping mechanism and other known or hereafter developed damping mechanisms may also be used. As one example, the current implementation uses an unpowered damping mechanism but a powered damping mechanism could also be used.

The motion damping mechanism 76 at the opening phase includes a gas strut 78 provided to the base 26 at the rear of the lid 24. As the lid 24 moves to the open position, the rear wall 36 of the lid 24 first encounters a head 82 of the gas strut 78, and the gas strut 78 compresses at a predetermined rate to slow the opening of the lid 24. As above, it is preferable to provide a gas strut 78 adjacent to each side wall 38 of the lid 24 to provide uniform damping of the movement of the lid 24.

The dampening at both the closing and the opening phases helps to reduce wear and tear on the hinge 50 connecting the lid 24 to the base 26. The dampening at the closing stage further helps to notify the operator that the electromagnets 72 will soon engage and thus aids in preventing the catching of fingers or hands underneath the lid 24 as it closes. It will be understood by one of skill in the art that other types of damping mechanisms can also be used.

The RF isolation container 20 in the present implementation further includes a control system 84. The control system 84 is in communication with the electromagnets 72 to control the operation of the electromagnets 72 to either hold the lid 24 in the closed position or to release the lid 24 so that it will move to the open position due to the biasing of the counterweight. The control system 84 will generally also have connectors (not shown) to the openings in the base 26 in order to provide control or other signals to the object that is being subject to a test (not shown). The control system may include, for example, a personal computer or the like.

The RF isolation container 20 may also include a tray 86 provided adjacent to the base which holds an object to be tested (not shown) for staging purposes.

Figure 9:
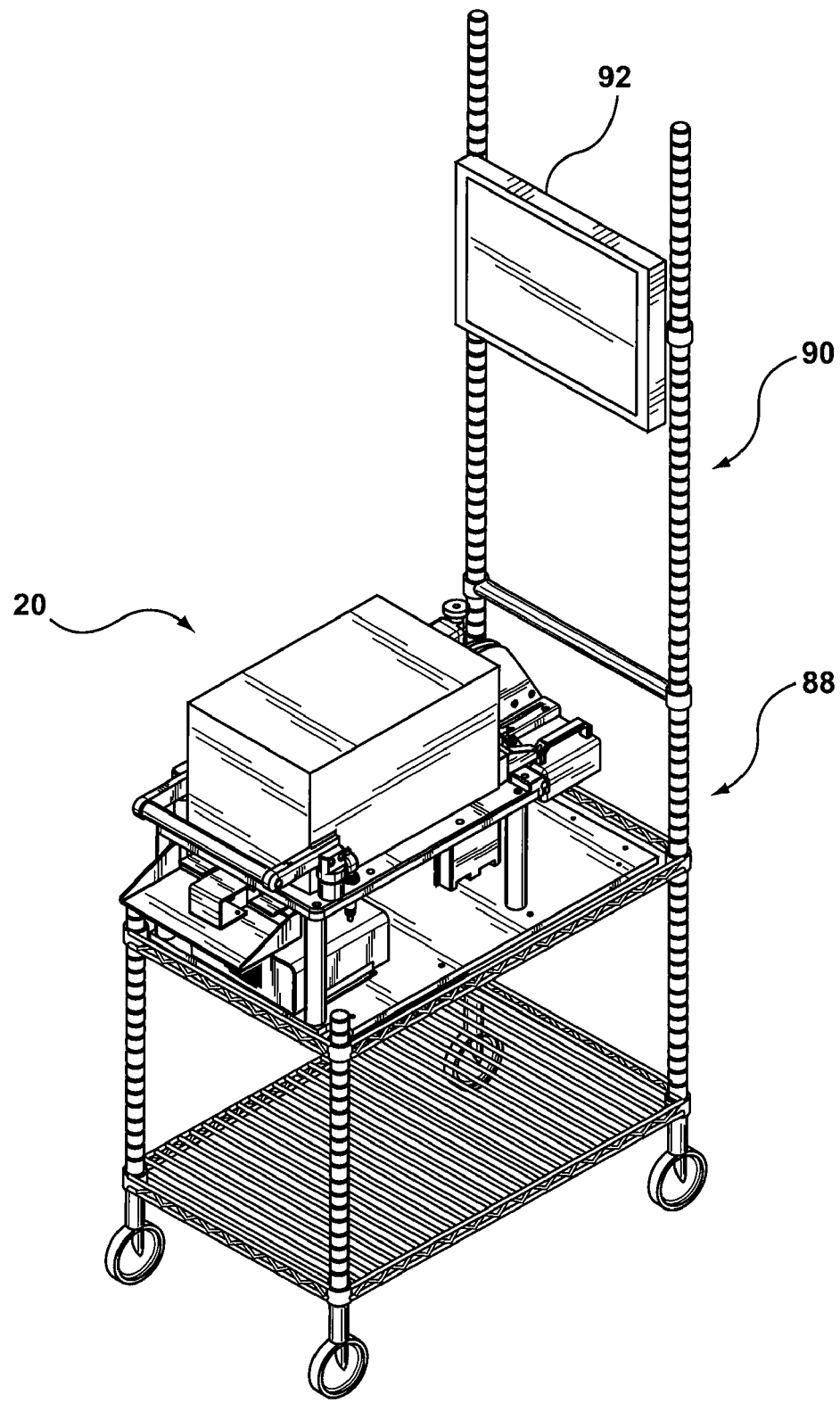
FIG. 9 is an isometric view of an RF isolation container according to an example implementation supported on a portable cart.

In a manufacturing environment, it is often important to move the RF isolation container 20, to a position adjacent an assembly line producing the object for test. FIG. 9 shows an RF isolation container 20 according to an example implementation that is installed on a cart 88 so that the RF isolation container 20 can be portably moved around within a manufacturing environment. The cart may be provided with a support structure 90 for mounting a display device 92 for displaying the readings from or results of the test to an operator.

In operation, the RF isolation container 20 will initially be in an open position due to the biasing of the counterweight 28. To begin an operation, an operator will place an object to be tested inside the RF isolation container 20. The operator will then use the handle 40 to move the lid 24 of the RF isolation container 20 down towards the base 26. This operation is facilitated by the appropriate biasing of the counterweight 28, which allows the operator to move the lid 24 with very little pressure being applied. As the lid 24 approaches the closed position, the motion damping mechanism 76 will slow the movement of the lid 24, thus alerting the operator that the lid 24 is nearly closed. The operator then applies a slightly higher pressure to overcome any resistance from the motion damping mechanism 76 until the strikes 74 engage with the electromagnets 72. The strikes 74 are then drawn towards the electromagnets 72, decreasing the pressure required to be applied by the operator. The force of the electromagnets 72 then brings the lid 24 into consistent physical and electrical contact with the gasket 46. In the groove 44 on the base 26.

A test is then performed on the object to be tested. In this test, the control system 84 may send various control signals to the object under test in order to conduct conventional RF testing on the object.

Following the test, the control system 84 releases the electromagnets 72, and the lid 24 automatically opens due to the biasing of the counterweight 28. As the lid 24 approaches the open position, the rear wall 36 of the lid 24 encounters the motion damping mechanism 76, which slows the movement of the lid 24 so that a reduced force/strain is placed on the hinges 50.

This implementation of the RF isolation container 20 has the benefit that the pressures and the amount and types of movement required from the operator is reduced from conventional systems. This results in a more ergonomically acceptable RF isolation container 20. Further, the use of an electromagnet locking mechanism 30 results in a consistent application of pressure to seal the lid 24 to the base 26. Still further, the biasing of the counterweight 28 such that the lid 24 opens automatically after the electromagnets 72 are released, provides a visual signal to an operator that a test has been completed and the object under test may be removed. Still further, the damping mechanism results in less wear on the various components of the RF isolation container 20.

It will be understood by one of skill in the art that the elements and mechanisms described above, such as the counterweight 28, the electromagnetic locking mechanism 30, and the motion damping mechanism 76, can be applied separately or in various combinations depending on the particular implementation. In particular any of these elements could be applied separately with respect to a new or retrofitted existing RF isolation container 20. It will be understood by one of skill in the art that these elements, while working well together in this implementation, do not necessarily need to be combined together in any particular implementation.

Further, various elements of the example implementation, such as the counterweight system 52, the electromagnet locking mechanisms 30 and the motion damping mechanisms 76, can be varied depending on the particular implementation. For example, the counterweight system 52 could be a fixed system in which there is no capability to adjust the position of the counterweight 28 once fixed. In this case, the weight of the counterweight 28 will need to be adjusted in advance. As another example, the electromagnetic locking mechanism 30 could include a solenoid provided to the base 26 and a pin provided to the lid 24 such that the pin would enter the solenoid and be held by electromagnetic force.

A portion of the disclosure of this patent document contains material which is subject to copyright protection. The copyright owner has no objection to the facsimile reproduction by anyone of the patent document or patent disclosure, as it appears in the Patent and Trademark Office patent file or records, but otherwise reserves all copyright rights whatsoever.

The invention has been described with regard to a number of embodiments. However, it will be understood by persons skilled in the art that other variants and modifications may be made without departing from the scope of the invention.

We claim:

1. An RF isolation container comprising:
   an electrically conductive housing, comprising a lid hingedly connected to a base such that the lid can be moved between a fully open position and a closed position;
   a counterweight provided to the housing such that the lid is biased to move to the fully open position, the counterweight counterbalancing the weight of the lid when the lid is in the fully open position, wherein the counterweight is fixed to the lid when the lid is moved to the fully open position; and
   a locking mechanism provided to the housing to lock the lid to the base when in the closed position;
   wherein the locking mechanism is an electromagnet locking mechanism comprising an electromagnet provided to one of the lid and the base, and a strike provided to the other of the lid and the base, such that when the lid is being closed, the strike comes into an electromagnetic field generated by the electromagnet and is drawn to and held by the electromagnet such that the lid is closed with a predetermined amount of pressure.

2. The container of claim 1, wherein the lid is a single formed piece of metal.

3. The container of claim 1, wherein the electromagnet is a DC electromagnet.

4. The container of claim 1, further comprising a sealing system between the base and the lid to reduce wear on the lid and the base while still providing electrical contact between the lid and the base when the lid is in the closed position.

5. The container of claim 4, wherein the predetermined amount of pressure is determined based on the force needed to form the electrical contact.

6. The container of claim 4, wherein the sealing system comprises a metallic gasket provided to the base such that the lid contacts the gasket when closed.

7. The container of claim 6, wherein the base is provided with a groove and the metallic gasket is placed in the groove to be flush with the upper surface of the base.

8. The container of claim 1, further comprising a motion damping mechanism that slows the movement of the lid when the lid approaches the fully open position.

9. The container of claim 8, wherein the motion damping mechanism comprises one or more motion dampers provided to the base and arranged such that the motion dampers contact a rear of the lid when the lid moves to the fully open position to dampen the motion of the lid towards the fully open position.

10. The container of claim 1, further comprising a motion damping mechanism that slows the movement of the lid when the lid approaches the closed position.

11. The container of claim 10, wherein the motion damping mechanism comprises one or more motion dampers provided to the base and one or more damper contactors provided to the lid, arranged such that the damper contactors contact the motion dampers when the lid moves to a closed position to dampen the motion of the lid towards the closed position.

12. The container of claim 1, wherein the base is substantially flat.

13. An RF isolation container comprising:
    an electrically conductive housing, comprising a lid hingedly connected to a base such that the lid can be moved between a fully open position and a closed position;
    a counterweight provided to the housing such that the lid is biased to move to the fully open position, the counterweight counterbalancing the weight of the lid when the lid is in the fully open position, wherein the counterweight is fixed to the lid when the lid is moved to the fully open position;
    a locking mechanism provided to the housing to lock the lid to the base when in the closed position;
    a counterweight support frame fixed to the lid;
    a counterweight support arm attached to the counterweight; and
    a counterweight adjustment gear that is connected with the counterweight support frame and engaged with the counterweight support arm.

14. The container of claim 13, wherein the counterweight support arm is movably attached to a surface of the counterweight.

15. The container of claim 14, wherein the counterweight adjustment gear is rotatably connected with the counterweight support frame.

16. An RF isolation container comprising:
    an electrically conductive housing, comprising a lid hingedly connected to a base such that the lid can be moved between a fully open position and a closed position;
    a counterweight provided to the housing such that the lid is biased to move to the fully open position, the counterweight counterbalancing the weight of the lid when the lid is in the fully open position, wherein the counterweight is fixed to the lid when the lid is moved to the fully open position;
    a locking mechanism provided to the housing to lock the lid to the base when in the closed position; and
    a sealing system between the base and the lid to reduce wear on the lid and the base while still providing electrical contact between the lid and the base when the lid is in the closed position.

17. The container of claim 16, wherein the locking mechanism is an electromagnet locking mechanism comprising:
    an electromagnet provided to one of the lid and the base; and
    a strike provided to the other of the lid and the base, such that when the lid is being closed, the strike comes into an electromagnetic field generated by the electromagnet and is drawn to and held by the electromagnet such that the lid is closed with a predetermined amount of pressure.

18. The container of claim 16, wherein the electromagnet is a DC electromagnet.

19. The container of claim 16, wherein the predetermined amount of pressure is determined based on the force needed to form the electrical contact.

* * * * *